United States Patent
Shimatani

(10) Patent No.: US 7,825,727 B2
(45) Date of Patent: Nov. 2, 2010

(54) DIFFERENTIAL AMPLIFIER

(75) Inventor: Atsushi Shimatani, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 12/458,332

(22) Filed: Jul. 8, 2009

(65) Prior Publication Data
US 2010/0033250 A1 Feb. 11, 2010

(30) Foreign Application Priority Data
Aug. 5, 2008 (JP) .............................. 2008-201733

(51) Int. Cl.
*H03F 3/45* (2006.01)
(52) U.S. Cl. .................. 330/253; 330/302; 330/255; 330/257
(58) Field of Classification Search .............. 330/253, 330/302, 255, 257
See application file for complete search history.

(56) References Cited
U.S. PATENT DOCUMENTS

| | | | | |
|---|---|---|---|---|
| 4,516,082 A | * | 5/1985 | Smith et al. | 330/296 |
| 5,399,992 A | * | 3/1995 | Itakura et al. | 330/257 |
| 6,100,762 A | * | 8/2000 | Kato | 330/255 |
| 6,424,585 B1 | * | 7/2002 | Ooishi | 365/226 |
| 6,429,700 B1 | * | 8/2002 | Yang | 327/108 |
| 6,970,043 B2 | * | 11/2005 | Pradhan et al. | 330/253 |

FOREIGN PATENT DOCUMENTS

JP 3550016 4/2006

* cited by examiner

*Primary Examiner*—Patricia Nguyen
(74) *Attorney, Agent, or Firm*—McGinn IP Law Group PLLC

(57) ABSTRACT

An input stage of a differential amplifier includes a differential pair formed by an N-channel MOS transistor MN1 having a gate connected to an INM and an N-channel MOS transistor MN2 having a gate connected to an INP, both having sources connected to each other, a constant current source connected to the sources of the MN1 and MN2, and a variable current source connected to the sources of the MN1 and MN2. A subsequent-stage processing circuit having an intermediate stage and an output stage includes a phase compensation capacitor and outputs an output responsive to a change in the differential inputs by charging and discharging the phase compensation capacitor through the constant current source. The variable current source turns ON when the change reaches a level causing a parasitic capacitor at the sources of the differential pair to be discharged, and supplies a current for discharging the parasitic capacitor.

7 Claims, 9 Drawing Sheets

DIFFERENTIAL AMPLIFIER

BACKGROUND

1. Field of the Invention

The present invention relates to a differential amplifier and, particularly, to a differential amplifier used in a source driver of a liquid crystal display panel.

2. Description of Related Art

An active matrix liquid crystal display device is known that includes a thin film transistor liquid crystal display (TFT-LCD), which is a TFT type liquid crystal display panel, a source driver placed on the upper side of the TFT-LCD and a gate driver placed on the side surface of the TFT-LCD. In such a liquid crystal display device, a differential amplifier for driving a capacitor load of a pixel is used in the source driver.

In the TFT-LCD, AC driving is performed in order to prevent burn-in due to DC voltage application. The AC driving of the LCD is a driving method that inverts the writing polarity centered at a common level every frame or line, and there are a plurality of types such as "frame inversion", "gate line inversion", "drain line inversion" and "dot inversion". The "frame inversion" is a method in which the writing polarity is inverted every frame, and the "gate line inversion" is a method in which the writing polarity in the scan line direction is the same and the polarity is inverted every N (N is an integer of two or above) lines in each frame and further the writing polarity is inverted every frame. The "drain line inversion" is a method in which the writing polarity in the data line direction is the same in each frame and the writing polarity is inverted every frame. The "dot inversion" is a method in which the writing polarity of adjacent pixels is inverted in each frame and further the writing polarity is inverted every frame.

FIG. 8 shows a source driver 10 and a TFT-LCD (which is also referred to hereinafter simply as an LCD) 20 in a liquid crystal display device. The source driver 10 includes a data register 11 that captures digital display signals R, G and B of a given number of bits (e.g. eight bits), a latch circuit 12 that latches the digital display signal in synchronization with a strobe signal ST, a D/A converter 13 that is composed of digital-to-analog converters of N (N is an integer of two or above) stages in parallel, a liquid crystal grayscale voltage generator 14 that has gamma conversion characteristics conforming to the characteristics of liquid crystals, and an N-number of voltage followers 15 (a voltage follower 15_1 to a voltage follower 15_N) that buffer the voltage from the D/A converter 13.

The LCD 20 includes TFTs 16 (a TFT 16_1 to a TFT 16_N) and pixel capacitors 17 (a pixel capacitor 17_1 to a pixel capacitor 17_N). Each TFT 16 is placed at the intersection between a data line and a scan line. The gate of each TFT 16 is connected to the scan line, and the source is connected to the data line. One end of each pixel capacitor 17 is connected to the drain of the TFT 16, and the other end is connected to a COM terminal. Although FIG. 8 shows the configuration of the LCD 20 of only one line for convenience of description, an actual LCD includes M (M is an integer of two or above) lines of the TFTs 16 shown in FIG. 8.

During the operation of the liquid crystal display device, a gate driver, which is not shown, sequentially drives the gates of the TFTs in each line.

The D/A converter 13 converts the digital display signal from the latch circuit 12 from digital to analog and supplies the obtained voltage to each of the N-number of the voltage follower 15_1 to the voltage follower 15_N. The voltage follower 15_1 to the voltage follower 15_N are differential amplifiers, and they perform differential amplification of the voltage supplied from the D/A converter 13 and apply the result to the pixel capacitor 17_1 to the pixel capacitor 17_N through the TFT 16_1 to the TFT 16_N.

The liquid crystal grayscale voltage generator 14 generates a reference voltage and supplies it to the D/A converter 13. The D/A converter 13 selects the reference voltage by a decoder composed of a ROM switch or the like, which is not shown.

The liquid crystal grayscale voltage generator 14 includes a resistance ladder circuit, for example, and it is driven by the voltage followers so as to reduce the impedance at each reference voltage point or to adjust the reference voltage.

Generally, writing to pixels of an LCD is performed by a differential amplifier (which is the voltage follower 15 in the example of FIG. 8) that serves as an output circuit of a source driver of the LCD. FIG. 9 is an equivalent of FIG. 10 of Japanese Patent No. 3550016, and it shows the differential amplifier disclosed in Japanese Patent No. 3550016. In the following description, a P-channel MOS transistor and an N-channel MOS transistor are referred to simply as a P-transistor and an N-transistor, respectively.

The differential amplifier shown in FIG. 9 is a high voltage differential amplifier for driving a grayscale voltage that is equal to or higher than one-half of a power supply voltage. In this differential amplifier, a differential stage includes an N-transistor differential pair (NM61 and NM62) to which a voltage that is equal to or higher than one-half of the voltage of a power supply 2, which is a higher voltage power supply, and equal to or lower than the voltage of the power supply 2 can be input. In the case of inputting a voltage that is equal to or higher than the voltage of a power supply 1, which is a lower voltage power supply, and equal to or lower than one-half of the voltage of the power supply 2, a differential amplifier including a P-transistor differential pair may be used.

As shown in FIG. 9, the sources of the NM61 and the NM62 are connected to each other, and the gate of the NM61 is connected to a – input terminal, and the gate of the NM62 is connected to a + input terminal. Further, an N-transistor NM63 is connected between the N-transistor differential pair and the power supply 1. The NM63 functions as a constant current source of the input stage, having the source connected to the power supply 1, the drain connected to the sources of the NM61 and the NM62, and the gate connected to a constant voltage source terminal bias 3.

The sources of P-transistors PM53 and PM54 are connected to the power supply 2. The gate and the drain of the PM53 and the gate of the PM54 are connected to the drain of the NM61, and the drain of the PM54 is connected to the drain of the NM62.

The source of a P-transistor PM55 is connected to the power supply 2 and the gate is connected to the drains of the PM54 and the NM62. Further, an N-transistor NM64 is connected between the drain of the PM55 and the power supply 1. The NM64 functions as a constant current source of the output stage, having the source connected to the power supply 1, the drain connected to the drain of the PM55, and the gate connected to the constant voltage source terminal bias 3.

The drain of the PM55 is connected to one end of a phase compensation capacitor C. A P-transistor PM56 having the gate connected to a constant voltage source terminal bias 4 and the source connected to the drain of the PM54 is connected between the other end of the phase compensation capacitor C and the gate of the PM55, thus serving as a zero point resistor.

The operation when the differential amplifier shown in FIG. 9 is connected in a voltage follower configuration is described hereinafter. The voltage follower connection is connecting the − input terminal and the output terminal of the differential amplifier. The differential amplifier in the voltage follower configuration is an amplifier with a high input impedance and a low output impedance, which outputs a voltage that is input to the + input terminal to the output terminal as it is.

If the voltages at the + input terminal and the output terminal are equal, a current that is one-half of the drain current flowing through the N-transistor NM63 in the input stage flows into the drains of the NM61 and the NM62.

If the voltage at the + input terminal becomes higher than the voltage at the output terminal, the drain current flowing through the N-transistor NM63 in the input stage flows into the NM62, and the current flowing into the NM61 becomes zero. Accordingly, the current flowing into the PM53 and the PM54 also becomes zero. In this case, the phase compensation capacitor C is discharged by a difference between the current of the PM54 and the current of the NM62, the gate voltage of the PM55 decreases, an output load capacitor is charged by the current of the PM55, and the voltage at the output terminal becomes higher according to the voltage at the + input terminal, so that the differential amplifier outputs a rising edge.

If the voltage at the + input terminal becomes lower than the voltage at the output terminal, the current flowing into the NM62 becomes zero, and the drain current flowing through the N-transistor NM63 in the input stage flows into the NM61. Accordingly, the drain current flowing through the N-transistor NM63 in the input stage flows also into the PM53 and the PM54. In this case, the phase compensation capacitor C is charged by a difference between the current of the PM54 and the current of the NM62, the gate voltage of the PM55 increases, the output load capacitor is discharged by the current of the N-transistor NM64 in the output stage, and the voltage at the output terminal becomes lower according to the voltage at the + input terminal, so that the differential amplifier outputs a falling edge.

In this manner, the voltage at the output terminal changes responsive to a change in the voltage at the + input terminal, the rising speed is determined by the current capacity of the constant current source NM63 in the input stage, the phase compensation capacitor C and the PM55, and the falling speed is determined by the current capacity of the constant current source NM63 in the input stage, the phase compensation capacitor C and the constant current source NM64 in the output stage.

FIG. 10 shows another example of a differential amplifier. The differential amplifier shown in FIG. 10 is also a high voltage differential amplifier for driving a grayscale voltage that is equal to or higher than one-half of a power supply voltage. In this differential amplifier, the input stage includes an N-transistor differential pair (MN1 and MN2) to which a voltage that is equal to or higher than one-half of the voltage of a VDD, which is a higher voltage power supply, and equal to or lower than the voltage of the VDD can be input. In the case of inputting a voltage that is equal to or higher than the voltage of a VSS, which is a lower voltage power supply, and equal to or lower than one-half of the voltage of the VDD, a differential amplifier including a P-transistor differential pair may be used. In the following description and drawings, "+ input terminal" is denoted by "INP" and "− input terminal" is denoted by "INM".

As shown in FIG. 10, the sources of the MN1 and the MN2 located in the input stage are connected to each other, and the gate of the MN1 is connected to the input terminal INM, and the gate of the MN2 is connected to the input terminal INP. An N-transistor MN10 is connected between the N-transistor differential pair and the VSS. The MN10 functions as a constant current source of the input stage, having the source connected to the VSS, the drain connected to the sources of the MN1 and the MN2, and the gate connected to a constant voltage source terminal BN1.

The sources of P-transistors MP3 and MP4 located in the intermediate stage are connected to the VDD. The gate and the drain of the MP3 and the gate of the MP4 are connected to the drain of the MN1, and the drain of the MP4 is connected to the drain of the MN2.

The source of a P-transistor MP7 is connected to the VDD, the gate is connected to a constant voltage source terminal BP3, and the drain is connected to the drains of the MP4 and the MN2. The source of a P-transistor MP8 is connected to the drain of the MP7, the gate is connected to a constant voltage source terminal BP4, and the drain is connected to the drain of an N-transistor MN7. The source of an N-transistor MN8 is connected to the drain of the MN7, the gate is connected to a constant voltage source terminal BN4, and the drain is connected to the drain of the MP7.

The source of a P-transistor MP9 located in the output stage is connected to the VDD, and the gate is connected to the drain of the MP7. The source of an N-transistor MN9 is connected to the VSS, and the gate is connected to the drain of the MN7. The drains of the MP9 and the MN9 are connected to each other, serving as an output terminal OUT.

Further, one end of a phase compensation capacitor C1 is connected to the drain of the MP9. The other end of the phase compensation capacitor C1 is connected to the drain of the MP7 and the gate of the MP9.

The operation when the differential amplifier shown in FIG. 10 is connected in a voltage follower configuration is described hereinafter.

If the voltages at the input terminal INP and the output terminal OUT are equal, a current that is one-half of the drain current flowing through the N-transistor MN10 in the input stage flows both into the MN1 and the MN2.

If the voltage at the input terminal INP becomes higher than the voltage at the output terminal OUT, the drain current flowing through the MN10 flows into the MN2, and the current flowing into the MN1 becomes zero. Accordingly, the current flowing into the MP3 and the MP4 also becomes zero. In this case, the phase compensation capacitor C1 is discharged by a difference between the current of the MP4 and the current of the MN2, the gate voltage of the MP9 decreases, an output load capacitor is charged by the current of the MP9, and the voltage at the output terminal OUT becomes higher according to the voltage at the input terminal INP.

If the voltage at the input terminal INP becomes lower than the voltage at the output terminal OUT, the current flowing into the MN2 becomes zero, and the drain current flowing through the MN10 flows into the MN1. Accordingly, the drain current flowing through the MN10 flows also into the MP3 and the MP4. In this case, the phase compensation capacitor C is charged by a difference between the current of the MP4 and the current of the MN2, and the gate voltage of the MP9 increases. Because the gate-to-source voltage (VGS) of the MP8 becomes larger with an increase in the gate voltage of the MP9, the drain current of the MP7 flows into the MP8 more than into the MN8. The current flowing into the MN8 thereby decreases, and the VGS of the MN8 becomes smaller, and the gate voltage of the MN9 increases. Then, the output load capacitor is discharged by the current of the MN9, and the voltage at the output terminal OUT becomes lower according to the voltage at the input terminal INP.

In this manner, the voltage at the output terminal OUT changes responsive to a change in the voltage at the input terminal INP, the rising speed is determined by the current capacity of the constant current source MN10 in the input stage, the phase compensation capacitor C1 and the MP9, and the falling speed is determined by the current capacity of the constant current source MN10 in the input stage, the phase compensation capacitor C1 and the MN9.

SUMMARY

The charging and discharging speed of the differential amplifiers shown in FIGS. 9 and 10 is as follows.

As described above, in the differential amplifier shown in FIG. 9, the voltage at the output terminal changes responsive to a change in the voltage at the + input terminal, the rising speed is determined by the current capacity of the constant current source NM63 in the input stage, the phase compensation capacitor C and the PM55, and the falling speed is determined by the current capacity of the constant current source NM63 in the input stage, the phase compensation capacitor C and the constant current source NM64 in the output stage.

The drain current of the MOS transistor is divided into a triode region (non-saturation region) in which the drain current increases substantially in proportion to the drain voltage and a pentode region (saturation region) in which the drain current does not substantially change with an increase in the drain voltage. Approximate expressions of the drain current in the triode region and the pentode region are the following Expressions 1 and 2, respectively. In the following expressions, the drain current, the gate-source voltage, the drain-source voltage, the gate width and the gate length are represented by "Id", "$V_{GS}$", "$V_{DS}$", "W" and "L", respectively.

$$I_d = \frac{1}{2}K\frac{W}{L}\{2(V_{GS} - V_{th})V_{DS} - V_{DS}^2\} \quad \text{Expression 1}$$

$$I_d = \frac{1}{2}K\frac{W}{L}(V_{GS} - V_{th})^2 \quad \text{Expression 2}$$

As shown in Expressions 1 and 2, the drain current of the MOS transistor depends on the gate-source voltage.

In the differential amplifier shown in FIG. 9, because the gate-source voltage of the PM55 differs depending on the state of the load being driven, the current capacity of the PM55, which is one factor for determining the rising speed, differs depending on the load state. On the other hand, because the gate-source voltage of the constant current source NM64 in the output stage is constant, the current capacity of the NM64, which is one factor for determining the falling speed, is constant regardless of the load state.

Therefore, in the differential amplifier shown in FIG. 9, while the rising speed depends on the load state, the falling speed does not depend on the load state. Accordingly, in this differential amplifier, the rising speed and the falling speed are different, which causes a load driving output waveform to be asymmetrical.

In the differential amplifier shown in FIG. 10, the voltage at the output terminal OUT changes responsive to a change in the voltage at the input terminal INP, the rising speed is determined by the current capacity of the constant current source MN10 in the input stage, the phase compensation capacitor C1 and the MP9, and the falling speed is determined by the current capacity of the constant current source MN10 in the input stage, the phase compensation capacitor C1 and the MN9. Because the output load capacitor is driven by a push-pull configuration of the MP9 and the MN9 in the differential amplifier shown in FIG. 10, it is easier to exploit the symmetry between the rising edge and the falling edge compared to the differential amplifier shown in FIG. 9. However, because a parasitic capacitor is added to the source of the differential pair in the input stage and the parasitic capacitor affects the slew rate of the differential amplifier, the rising speed and the falling speed of the differential amplifier is different, which causes a load driving output waveform to be asymmetrical. This is described in detail hereinbelow.

The slew rate at the rising edge in the differential amplifier shown in FIG. 10 is determined as follows.

If a pulse shape with a height of Vip and a time of t1 is input, the current flowing into the phase compensation capacitor C1 in this period is the sum (2I1+is) of the current "2I1" of the constant current source in the input stage and the current "is" flowing through the parasitic capacitor of the source (source Tail capacitor) Cs of the differential pair. The output voltage vo(t) of the differential amplifier is represented by the following Expression 3.

$$vo(t) \cong \frac{1}{C1}\int_0^\tau [2I1 + is(t)]dt \quad \text{Expression 3}$$

Further, because the MN1 is ON at this time, the MN1 functions as a source follower, and the waveform vin(t) input to the gate and the waveform at the source are substantially the same. Thus, the current is(t) flowing through the parasitic capacitor Cs is represented by the following Expression 4.

$$is(t) \cong \frac{dvin}{dt} \cong \frac{CsVip}{t1} \quad 0 < t < t1 \quad \text{Expression 4}$$

The above Expression 3 and Expression 4 derive the following Expression 5 and Expression 6.

$$vo(t) \cong \frac{1}{C1}\int_0^\tau 2I1 dt + \frac{1}{C1}\int_0^{t1}\frac{CsVip}{t1}dt \quad \text{Expression 5}$$

$$vo(t) \cong \frac{Cs}{C1}Vip + \frac{2I1}{C1}t \quad \text{Expression 6}$$

As shown in Expression 6, when the differential amplifier outputs a rising edge, "hopping" of "CsVip/C1" occurs at the start (t=0), and then the slew rate becomes "2I1/C1" that is determined by the current of the constant current source in the input stage and the load capacitor C1.

Further, the slew rate at the falling edge in the differential amplifier shown in FIG. 10 is determined as follows.

In the case of the falling edge, the MN1 is OFF, and the MN2 is ON. In this state, the MN2 functions as a source follower, and the signal waveform at the gate and the signal waveform at the source are substantially the same. Thus, the current is(t) flowing through the parasitic capacitor Cs is represented by the following Expression 7. If the currents flowing through the parasitic capacitor Cs and the load capacitor C1 are "is" and "ic", respectively, the following Expression 7 is obtained.

$$\frac{dvo}{dt} \cong \frac{is}{Cs} \cong \frac{ic}{C1} \quad \text{Expression 7}$$

Further, because the current ic flowing through the load capacitor C1 is "2I1-is", which is the same as the current flowing through the MN2, the following Expression 8 is obtained.

$$\frac{is}{Cs} \cong \frac{2I1 - is}{C1} \quad \text{Expression 8}$$

The above Expression 7 and Expression 8 derive the following Expression 9.

$$\frac{dvo}{dt} \cong \frac{is}{Cs} \cong \frac{2I1}{Cs + C1} \quad \text{Expression 9}$$

As represented by the above Expression 9, when the differential amplifier shown in FIG. 10 outputs a falling edge, the slew rate is determined by the current of the constant current source in the input stage and the parasitic capacitor Cs of the source of the differential pair.

As described above, in the differential amplifier of FIG. 10 that includes the N-transistor differential pair in the input stage, "hopping" of "CsVip/C1" occurs at the start of the rising edge, and then the slew rate becomes "2I1/C1" that is determined by the current of the constant current source in the input stage and the load capacitor C1. On the other hand, at the falling edge, the slew rate is "2I1/(Cs+C1)". Therefore, the slew rate differs between the rising edge and the falling edge, and the output waveform is thus asymmetrical between the rising edge and the falling edge.

The differential amplifier shown in FIG. 10 is an example in which the differential pair in the input stage is formed by N-transistors. In the case of a differential amplifier in which the differential pair in the input stage is formed by P-transistors, "hopping" of "CsVip/C1" occurs at the start of the falling edge, and then the slew rate becomes "2I1/C1". On the other hand, at the rising edge, the slew rate is "2I1/(Cs+C1)". Therefore, the slew rate differs between the rising edge and the falling edge, and the output waveform is thus asymmetrical between the rising edge and the falling edge, as in the differential amplifier shown in FIG. 10.

When writing a pixel of the TFT-LCD at a certain grayscale, the operation of the differential amplifier in the source driver differs depending on the last grayscale voltage for the pixel. If the last grayscale voltage is lower than the next grayscale voltage to be written, the differential amplifier performs charging (rising) operation of the pixel capacitor, and if the last grayscale voltage is higher than the next grayscale voltage to be written, the differential amplifier performs discharging (falling) operation of the pixel capacitor.

In the case of using the above differential amplifier for the source driver, the charging speed and the discharging speed of the differential amplifier are different and thereby the load driving output waveform is different, so that the writing voltage at the pixel differs between the rising edge and the falling edge. This has an adverse affect on display such as that different colors are displayed despite that input data indicates the same grayscale. In this manner, the rising/falling speed of the differential amplifier, which is thus the degree of symmetry of the load driving output waveform, is one of parameters indicating the performance of the source driver in the LCD, and it is a key issue to maintain the symmetry.

An exemplary aspect of an embodiment of the present invention is a differential amplifier. The differential amplifier includes an input circuit that receives differential inputs through a first input terminal and a second input terminal, and a subsequent-stage processing circuit that outputs an output according to the differential inputs received by the input circuit. The input circuit includes a differential pair that is formed by a first transistor having a gate connected to the first input terminal and a second transistor having a gate connected to the second input terminal, the first transistor and the second transistor having sources connected to each other, a constant current source that is connected to the sources of the first transistor and the second transistor, and a variable current source that is connected to the sources of the first transistor and the second transistor. The subsequent-stage processing circuit includes a phase compensation capacitor and outputs an output responsive to a change in the differential inputs by charging and discharging the phase compensation capacitor through the constant current source of the input circuit. The variable current source of the input circuit turns ON on condition that a change in the differential inputs reaches a level causing a parasitic capacitor at the sources of the differential pair to be charged or discharged and supplies a current for charging or discharging the parasitic capacitor.

The implementation of the differential amplifier according to the above exemplary aspect as any of a method, a system and a device is also effective as another exemplary aspect of an embodiment of the present invention.

According to the exemplary aspect of an embodiment of the present invention, it is possible to improve the symmetry of the output waveform between the rising edge and the falling edge in the differential amplifier.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Before describing specific exemplary embodiments of the present invention, the principle underlying the present invention is described hereinafter in comparison with the differential amplifier shown in FIG. 10.

Figure 10:
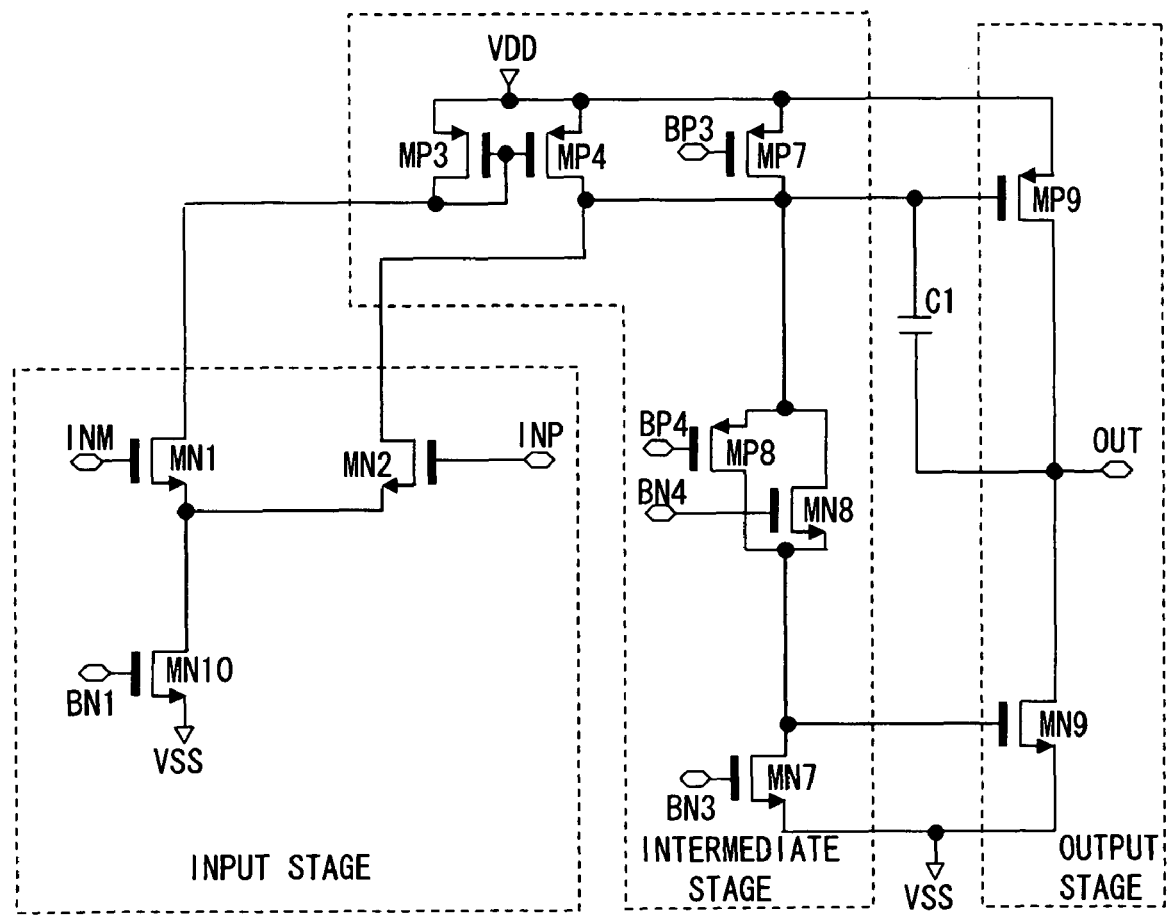
FIG. 10 is a view showing an example of the configuration of a differential amplifier used in a source driver of the liquid crystal display device shown in FIG. 8.
Figure 11:
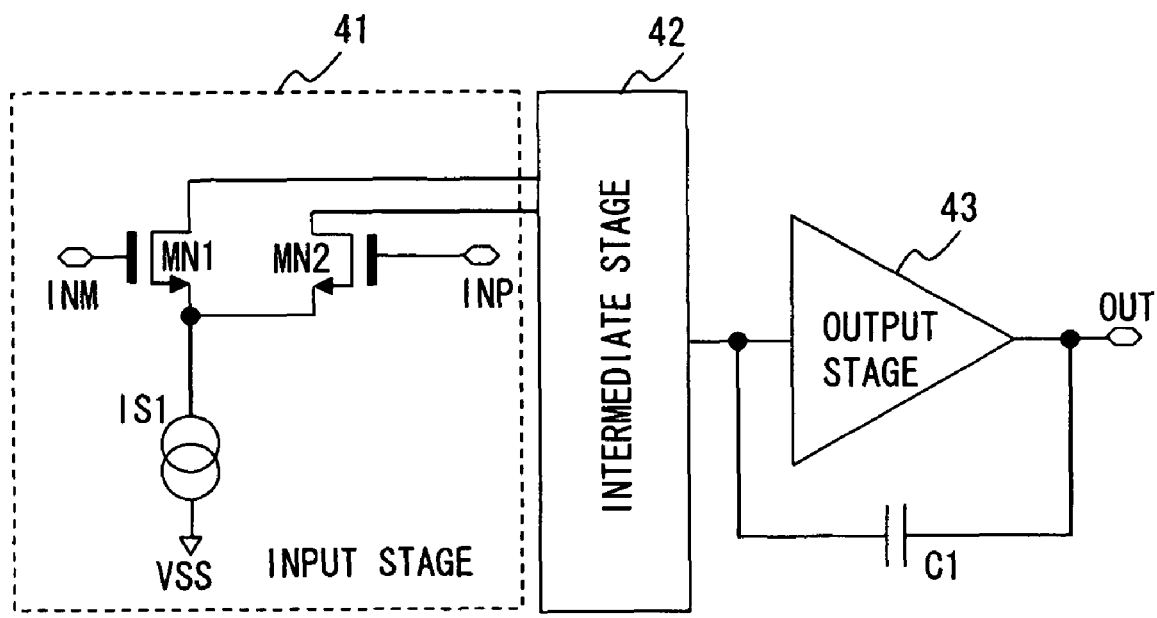
FIG. 11 is a schematic view of the differential amplifier shown in FIG. 10.

FIG. 11 is a schematic view of the differential amplifier shown in FIG. 10. The differential amplifier includes an input stage 41, an intermediate stage 42 and an output stage 43. In the input stage 41, the sources of the N-transistors MN1 and MN2 are connected to form the N-transistor differential pair. The constant current source IS1 is connected between the N-transistor differential pair and the VSS. The input terminals INM and INP are connected to the gates of the MN1 and MN2, respectively, and the drains of the MN1 and MN2 are connected and functions as an output terminal of the input stage 41. In the intermediate stage 42, an input is connected to the output of the input stage 41 (the drains of the MN1 and MN2), and an output is connected to an input of the output stage 43, and I-V conversion or I-I conversion is performed. In the output stage 43, an input is connected to the output of the intermediate stage 42, and an output is connected to an output terminal OUT, and V-V conversion or I-V conversion is performed.

As described earlier, the differential amplifier discharges the phase compensation capacitor C1 with the current of the constant current source IS1 through the MN2 at the rising edge, and charges the phase compensation capacitor C1 with the current of the constant current source IS1 through the MN1 and further discharges the parasitic capacitor at the source of the N-transistor differential pair at the falling edge. Accordingly, the slew rate is lower at the falling edge than at the rising edge.

Figure 1:
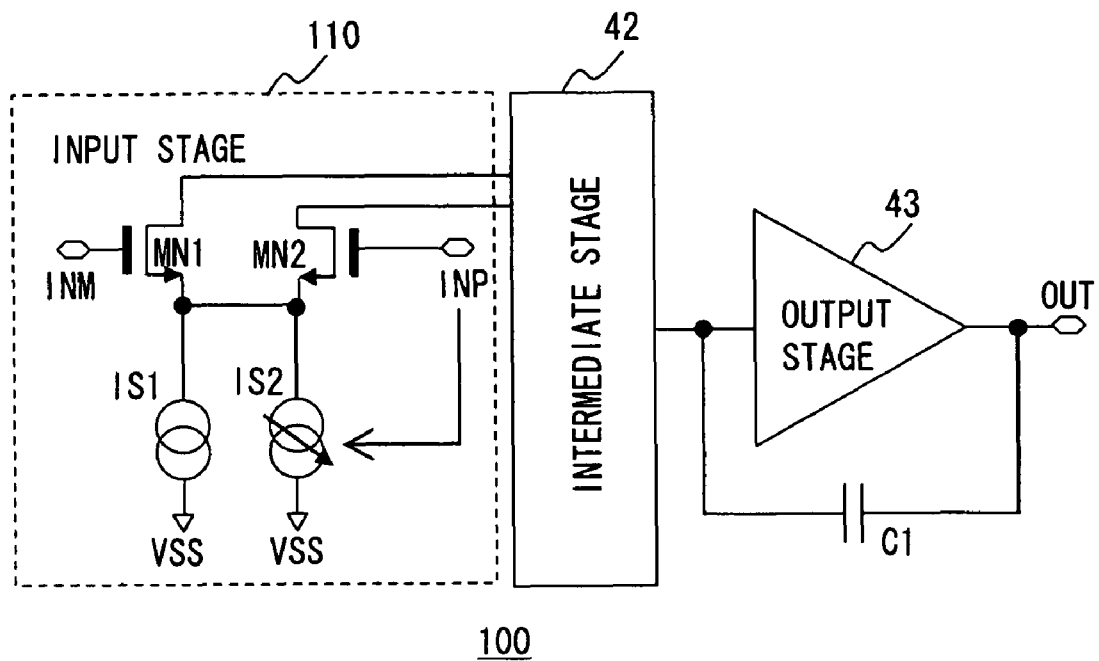
FIG. 1 is a schematic view of a differential amplifier representing the principle of the present invention.

FIG. 1 is a schematic view of a differential amplifier 100 based on the principle of the present invention. The differential amplifier 100 includes an input stage 110, an intermediate stage 42 and an output stage 43. In FIG. 1, the elements having the same functions as those in FIG. 10 are denoted by the same reference numerals and not repeatedly described in detail.

The input stage 110 includes a variable current source IS2 that is controlled by a signal input to the INP, between the MN2 of the N-transistor differential pair and the VSS, in addition to the elements in the input stage 41 of the differential amplifier shown in FIG. 10.

The operation state of the differential amplifier 100 is divided into the following three states, depending on the input voltages (the voltages at the input terminals INP and INM).

If the voltages at the INP and INM are equal, the current of the variable current source IS2 is zero, and a current that is one-half of the current of the constant current source IS1 flows both into the MN1 and the MN2.

If the voltage at the INP becomes higher than the voltage at the INM, that is, when the differential amplifier 100 outputs a rising edge, the current of the variable current source IS2 is zero, and the whole current of the constant current source IS1 flows into the MN2, and no current flows into the MN1. At this time, the phase compensation capacitor C1 is discharged with the current of the constant current source IS1 through the MN2, as in the differential amplifier shown in FIG. 11.

If the voltage at the INP becomes lower than the voltage at the INM, that is, when the differential amplifier 100 outputs a falling edge, the whole current of the constant current source IS1 flows into the MN1, and no current flows into the MN2. Further, a current flows from the variable current source IS2. Therefore, the phase compensation capacitor C1 is charged with the current of the constant current source IS1 through the MN1, and the parasitic capacitor at the source of the N-transistor differential pair is discharged by the current of the variable current source IS2.

Therefore, in the differential amplifier 100 shown in FIG. 1, the current of the variable current source IS2 is used for discharging the parasitic capacitor at the source of the N-transistor differential pair at the falling edge. It is thereby possible to prevent the current of the constant current source IS1 that is used for charging the phase compensation capacitor C1 from being divided for discharging the parasitic capacitor at the source of the N-transistor differential pair. As a result, it is possible to suppress the reduction of the slew rate at the falling edge in the differential amplifier 100, thus improving the symmetry of the output waveform between the rising edge and the falling edge.

Figure 2:
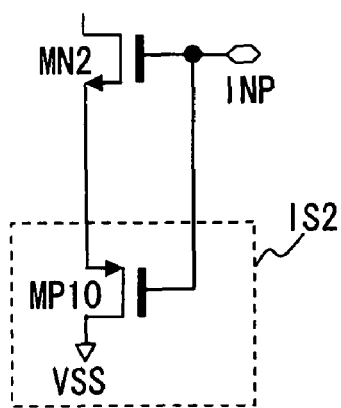
FIG. 2 is a view showing an example of the configuration of a variable current source in the input stage of the differential amplifier shown in FIG. 1.

FIG. 2 shows a specific example of the variable current source IS2. The variable current source IS2 shown in FIG. 2 is formed by a P-transistor MP10 having the source connected to the sources of the MN1 and the MN2, the drain connected to the VSS and the gate connected to the input terminal INP.

In the differential amplifier 100 that uses the variable current source IS2 shown in FIG. 2, if the voltages at the INP and the INM are equal, a current that is one-half of the current of the constant current source IS1 flows both into the MN1 and the MN2. Because the source voltage of the MN2 is lower than the voltage at the INP, the gate voltage of the MP10 is higher than the source voltage, so that no current flows into the MP10.

Further, if the voltage at the INP becomes higher than the voltage at the INM, which is at the rising edge, the whole current of the constant current source IS1 flows into the MN2, and no current flows into the MN1. In this case also, because the source voltage of the MN2 is lower than the voltage at the INP, the gate voltage of the MP10 is higher than the source voltage, so that no current flows into the MP10.

On the other hand, if the voltage at the INP becomes lower than the voltage at the INM, which is at the falling edge, the whole current of the constant current source IS1 flows into the MN1, and no current flows into the MN2. In this case, because the source voltage of the MN2 is higher compared to the INP, the gate voltage of the MP10 is lower than the source voltage, so that a current flows into the MP10.

Figure 3:
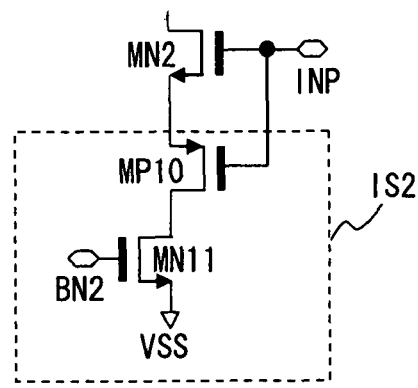
FIG. 3 is a view showing another example of the configuration of a variable current source in the input stage of the differential amplifier shown in FIG. 1.

FIG. 3 shows another example of the variable current source IS2. The variable current source IS2 shown in FIG. 3 includes a P-transistor MP10 and an N-transistor MN11. The source of the MP10 is connected to the sources of the MN1 and the MN2, the drain is connected to the drain of the MN11, and the gate is connected to the input terminal INP. The source of the MN11 is connected to the VSS, the drain is connected to the drain of the MP10, and the gate is connected to a constant voltage source terminal BN2.

In the differential amplifier 100 that uses the variable current source IS2 shown in FIG. 3, if the voltages at the INP and the INM are equal, a current that is one-half of the current of the constant current source IS1 flows both into the MN1 and the MN2. Because the source voltage of the MN2 is lower compared to the INP, the gate voltage of the MP10 is higher than the source voltage, so that the MP10 turns OFF.

Further, if the voltage at the INP becomes higher than the voltage at the INM, which is at the rising edge, the whole current of the constant current source IS1 flows into the MN2, and no current flows into the MN1. In this case also, because the source voltage of the MN2 is lower compared to the INP, the gate voltage of the MP10 is higher than the source voltage, so that the MP10 turns OFF.

On the other hand, if the voltage at the INP becomes lower than the voltage at the INM, which is at the falling edge, the whole current of the constant current source IS1 flows into the MN1, and no current flows into the MN2. In this case, because the source voltage of the MN2 is higher than the voltage at the INP, the gate voltage of the MP10 is lower than the source voltage, so that the MP10 turns ON. Accordingly, a current that is biased by the MN11 flows into the MP10.

In the variable current source IS2 shown in FIG. 3, the current of the MN11 is used for discharging the parasitic capacitor at the source of the N-transistor differential pair. Because the amount of current of the MN11 is constant, it is possible to supply a more stable amount of current than the variable current source IS2 shown in FIG. 2 when the voltage of the VDD is unstable, thus allowing easy control.

The differential amplifier 100 described above includes the N-transistor differential pair in the input stage and receives a voltage that is equal to or higher than one-half of the voltage of the VDD and equal to or lower than the voltage of the VDD. The technique according to exemplary embodiments of the present invention may be also used in a differential amplifier that includes a P-transistor differential pair in the input stage and receives a voltage that is equal to or higher than the voltage of the VSS and equal to or lower than one-half of the voltage of the VDD. In this case, a variable current source that charges a parasitic capacitor at the source of the P-transistor differential pair at the rising edge may be placed.

Exemplary embodiments of the present invention are described hereinafter with reference to the drawings.

First Exemplary Embodiment

Figure 4:
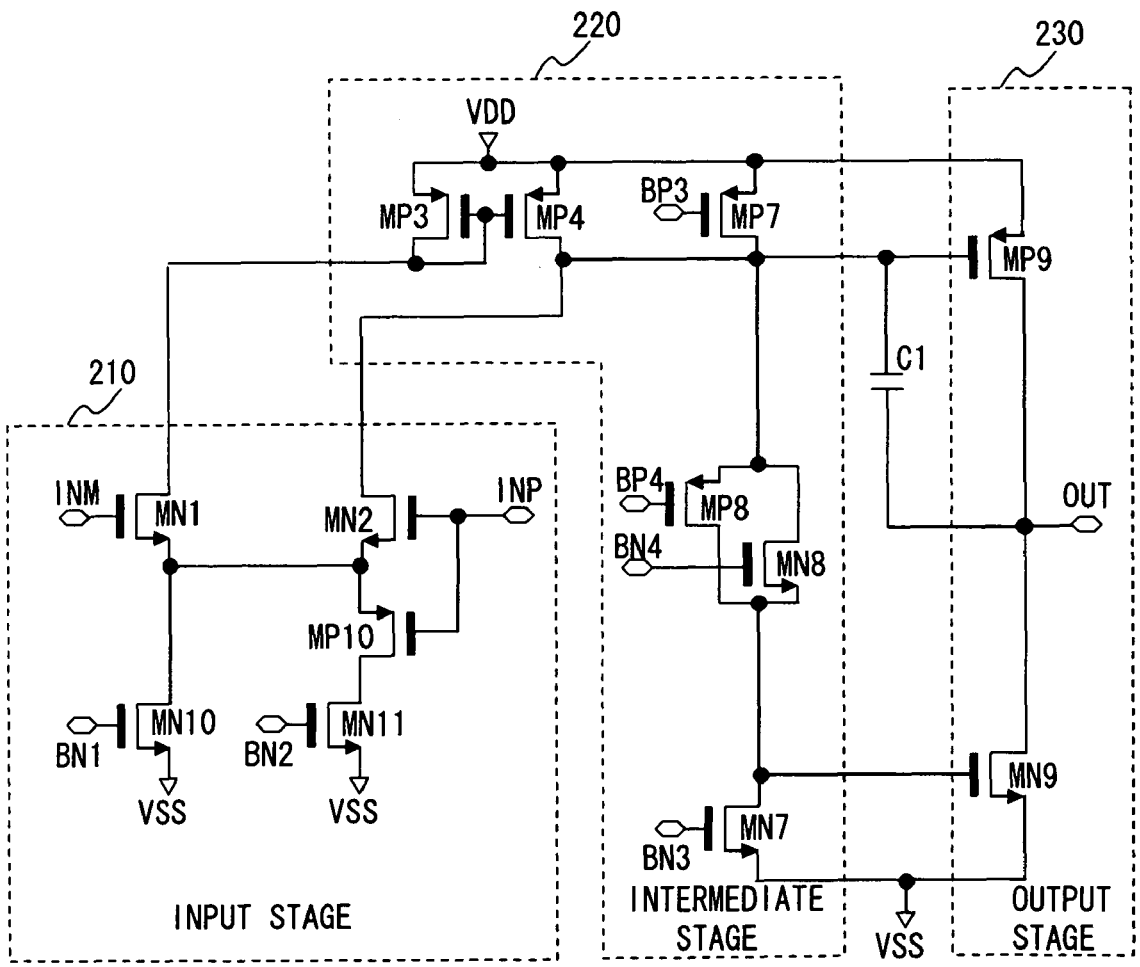
FIG. 4 is a view showing a differential amplifier according to a first exemplary embodiment of the present invention.

FIG. 4 shows a differential amplifier 200 according to a first exemplary embodiment of the present invention. The differential amplifier 200 includes an input stage 210, an intermediate stage 220 and an output stage 230.

The input stage 210 includes an N-transistor differential pair (MN1 and MN2) to which a voltage that is equal to or higher than one-half of the voltage of a VDD and equal to or lower than the voltage of the VDD can be input, and the sources of the MN1 and the MN2 are connected to each other. An N-transistor MN10 is connected between the N-transistor differential pair and a VSS. The MN10 functions as a constant current source of the input stage, having the source connected to the VSS, the drain connected to the sources of the MN1 and the MN2, and the gate connected to a constant voltage source terminal BN1. Further, an N-transistor MN11 is connected between the N-transistor differential pair and the VSS.

The input stage 210 in the differential amplifier 200 is configured by applying the variable current source IS2 shown in FIG. 3 to the input stage 110 shown in FIG. 1, and the MN10 functions as the constant current source IS1, and the MP10 and the MN11 functions as the variable current source IS2. Further, the intermediate stage 220 in the differential amplifier 200 has the same configuration as the intermediate stage of the differential amplifier shown in FIG. 10, and the output stage 230 has the same configuration as the output stage of the differential amplifier shown in FIG. 10, and therefore those stages are not repeatedly described in detail.

In the differential amplifier 200 shown in FIG. 4, at the rising edge, the whole current of the constant current source IS1 flows into the MN2 and no current flows into the MN1. Further, the MP10 turns OFF. Thus, the operation at the rising edge is the same between the differential amplifier 200 and the differential amplifier shown in FIG. 10.

On the other hand, at the falling edge, the whole current of the constant current source IS1 flows into the MN1 and no current flows into the MN2. Further, the MP10 turns ON, so that a current biased by the MN11 flows into the MP10. It is thereby possible to save the current flowing into the MN10 at the falling edge from being divided for discharging the parasitic capacitor at the source of the N-transistor differential pair as in the differential amplifier shown in FIG. 10, thus improving the symmetry of the output waveform between the rising edge and the falling edge.

Second Exemplary Embodiment

Figure 5:
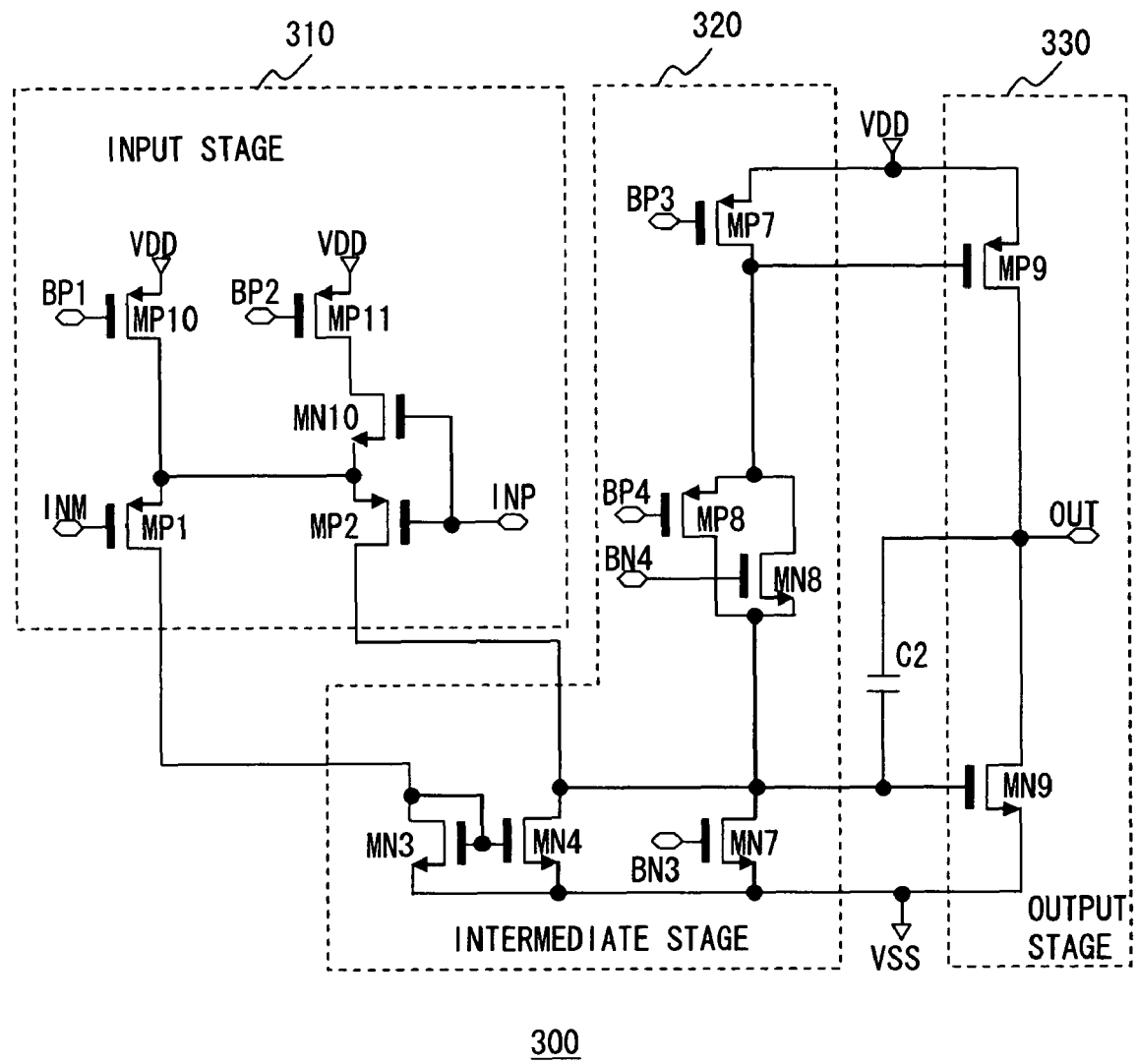
FIG. 5 is a view showing a differential amplifier according to a second exemplary embodiment of the present invention.

FIG. 5 shows a differential amplifier 300 according to a second exemplary embodiment of the present invention. The differential amplifier 300 includes an input stage 310, an intermediate stage 320 and an output stage 330.

The input stage 310 includes a P-transistor differential pair (MP1 and MP2) to which a voltage that is equal to or higher than the voltage of a VSS and equal to or lower than one-half of the voltage of a VDD can be input, and the sources of the MP1 and the MP2 are connected to each other. The gate of the MP1 is connected to an input terminal INM, and the gate of the MP2 is connected to an input terminal INP. A P-transistor MP10 is connected between the P-transistor differential pair and the VDD. The MP10 functions as a constant current source, having the source connected to the VDD, the drain connected to the sources of the MP1 and the MP2, and the gate connected to a constant voltage source terminal BP1.

In the input stage 310, an MN10 and an MP11 form a variable current source. The source of the MN10 is connected to the sources of the MP1 and the MP2, the drain is connected to the drain of the MP11, and the gate is connected to the input terminal INM. The drain of the MP11 is connected to the drain of the MN10, the source is connected to the VDD, and the gate is connected to a constant voltage source terminal BP2.

In the intermediate stage 320, the sources of N-transistors MN3 and MN4 are connected to the VSS. The gate and the drain of the MN3 and the gate of the MN4 are connected to the drain of the MP1, and the drain of the MN4 is connected to the drain of the MP2.

The source of an N-transistor MN7 is connected to the VSS, the gate is connected to a constant voltage source terminal BN3, and the drain is connected to the drains of the MN4 and the MP2. The source of a P-transistor MP8 is connected to the drain of a P-transistor MP7, the gate is connected to a constant voltage source terminal BP4, and the drain is connected to the drain of the MN7. The source of an N-transistor MN8 is connected to the drain of the MN7, the gate is connected to a constant voltage source terminal BN4, and the drain is connected to the drain of the MP7.

In the output stage 330, the source of a P-transistor MP9 is connected to the VDD, and the gate is connected to the drain of the MP7. The source of an N-transistor MN9 is connected to the VSS, and the gate is connected to the drain of the MN7. The drains of the MP9 and the MN9 are connected to serve as an output terminal OUT.

Further, one end of a phase compensation capacitor C2 is connected to the drain of the MN9. The other end of the phase compensation capacitor C2 is connected to the drain of the MN7 and the gate of the MN9.

In the differential amplifier 300, at the falling edge, the whole drain current of the constant current source MP10 flows into the MP2, no current flows into the MP1, and the phase compensation capacitor C2 is charged, so that the voltage at the output terminal OUT decreases according to the voltage at the input terminal INP. Because the MN10 is OFF, the variable current source formed by the MN10 and the MP11 does not affect the output waveform.

On the other hand, at the rising edge, the whole drain current of the constant current source MP10 flows into the MP1, no current flows into the MP2, and the phase compensation capacitor C2 is discharged, so that the voltage at the output terminal OUT increases according to the voltage at the input terminal INP. At this time, if the variable current source formed by the MN10 and the MP11 is not placed, the current flowing into the MP10 is used also for charging the parasitic capacitor at the source of the P-transistor differential pair, which degrades the symmetry of the output waveform between the rising edge and the falling edge.

In the differential amplifier 300 according to the exemplary embodiment, because the MN10 of the variable current source turns ON at the rising edge, the current biased by the MP11 flows into the MN10, which is used for charging the parasitic capacitor at the source of the P-transistor differential pair. It is thereby possible in the differential amplifier 300 to save the current flowing into the MP10 at the rising edge from being divided for charging the parasitic capacitor at the source of the P-transistor differential pair, thus improving the symmetry of the output waveform between the rising edge and the falling edge.

Third Exemplary Embodiment

Figure 6:
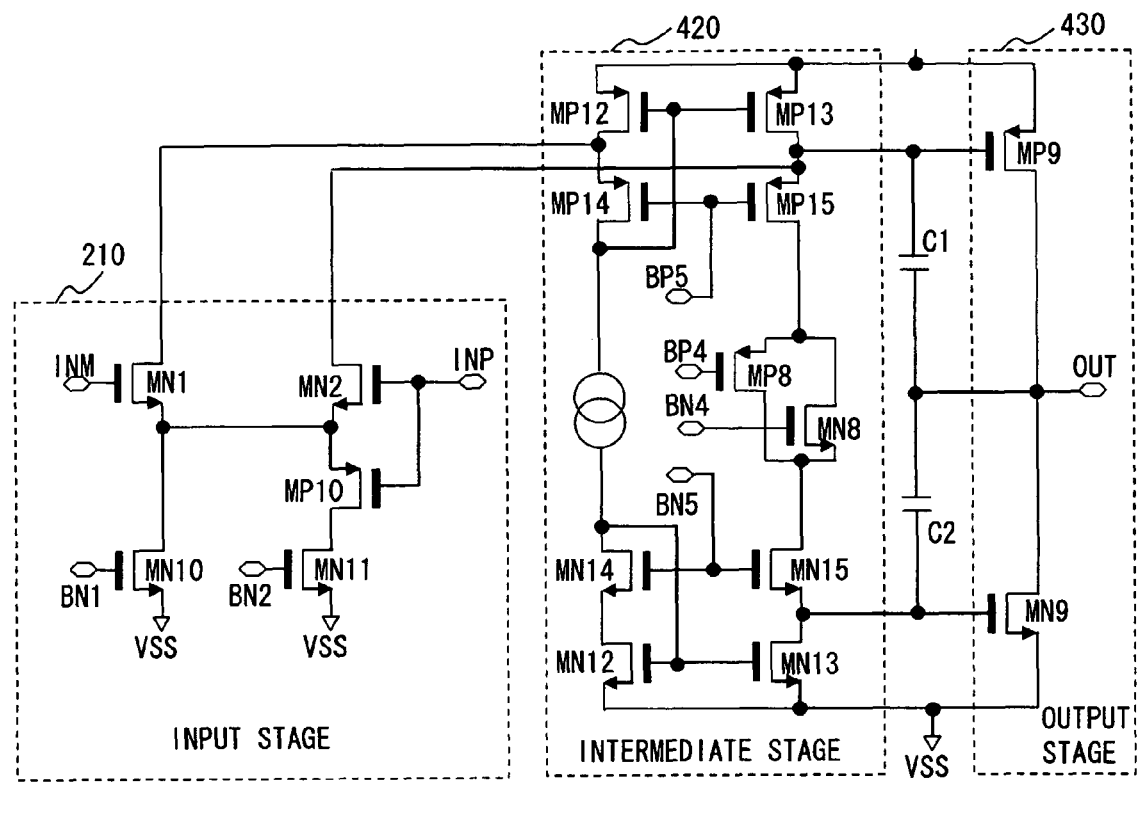
FIG. 6 is a view showing a differential amplifier according to a third exemplary embodiment of the present invention.

FIG. 6 shows a differential amplifier 400 according to a third exemplary embodiment of the present invention. The differential amplifier 400 includes an input stage 210, an intermediate stage 420 and an output stage 430.

The input stage 210 is the same as the input stage 210 in the differential amplifier 200 according to the first exemplary embodiment shown in FIG. 4.

The intermediate stage 420 is an intermediate stage in a folded cascode configuration, and it includes two floating current sources (current source symbol and MN8/MP8).

The drain of the N-transistor MN1 in the input stage 210 is connected to the drain of a P-transistor MP12 and the source of a P-transistor MP14 in the intermediate stage 420, and the drain of the N-transistor MN2 is connected to the drain of a P-transistor MP13 and the source of a P-transistor MP15 in the intermediate stage 420.

The sources and the gates of the P-transistors MP12 and MP13 are respectively connected to each other, and the connected sources are connected to the VDD.

The source of the P-transistor MP14 is connected to the drain of the MP12, and the drain of the P-transistor MP14 is connected to the connected gates of the MP12 and the MP13. The source of the P-transistor MP15 is connected to the drain of the MP13, and the drain of the P-transistor MP15 is connected to the source of a P-transistor MP8 and the drain of an N-transistor MN8. The gates of the MP14 and the MP15 are connected to each other and further connected to a constant voltage source terminal BP5.

The sources and the gates of N-transistors MN12 and MN13 are respectively connected to each other, and the connected sources are connected to the VSS. The drains of the MN12 and the MN13 are connected to the sources of N-transistors MN14 and MN15, respectively. The drain of the MN14 is connected to the connected gates of the MN12 and the MN13. The drain of the MN15 is connected to the source of the MN8 and the drain of the MP8. The gates of the MN14 and the MN15 are connected to each other and further connected to a constant voltage source terminal BN5.

The gate of the P-transistor MP8 is connected to a constant voltage source terminal BP4, the source is connected to the drain of the MP15, and the drain is connected to the drain of the MN15.

The gate of the N-transistor MN8 is connected to a constant voltage source terminal BN4, the source is connected to the drain of the MN15, and the drain is connected to the drain of the MP15.

The MP8 and the MN8 operate as a floating current source.

The output stage 430 is a class AB output stage that is controlled by the bias voltages BP4 and BN4, the MN8 and the MP8.

A P-transistor MP9 is an output transistor having the source connected to the VDD, the gate connected to the source of the MP8, and the drain connected to the output terminal OUT.

An N-transistor MN9 is an output transistor having the source connected to the VSS, the gate connected to the source of the MN8, and the drain connected to the output terminal OUT.

One end of a phase compensation capacitor C1 is connected to the gate of the MP9, and the other end is connected to the output terminal OUT. One end of a phase compensation capacitor C2 is connected to the gate of the MN9, and the other end is connected to the output terminal OUT.

The operation when the differential amplifier shown in FIG. 6 is connected in a voltage follower configuration is described hereinafter. It is assumed in this example that the drain current of the N-transistor MN10 that forms a constant current source in the input stage is 2I.

If the voltages at the + input terminal and the output terminal are equal, the current I that is one-half of the drain current flowing through the N-transistor MN10 in the input stage flows both into the drains of the MN1 and the MN2.

If the voltage at the + input terminal becomes higher than the voltage at the output terminal, the drain current 2I flowing through the MN10 flows into the MN2, and no current flows into the MN1. Further, if the current of an intermediate stage floating current source symbol is Im, the current flowing into the MP12 is equal to the current Im of the floating current source because the current of the MN1 is zero. Since the MP12 and the MP13 form a current mirror, the current that is equal to the current Im of the floating current source flows also into the MP13. Because the current of 2I flows into the MN2, if the current Im of the MP13 is not larger than 2I, the current of the MP15, the MP8, the MN15 and the MN8 that form the intermediate stage becomes zero, and the bias of the output stage becomes indeterminate. It is thereby necessary that a current larger than the current 2I of the input stage constant current source flows into the intermediate stage floating current source. Therefore, the current of the intermediate stage floating current source is set to be 3I.

Then, the current flowing into the MP12 and the MP13 is 3I, and the current flowing into the MP15 is I because the current 2I out of the current 3I flowing through the MP13 is diverged into the MN2.

Further, the current flowing into the MN12 is the current 3I of the intermediate stage floating current source. Because the MN12 and the MN13 form a current mirror, the current flowing into the MN13 is 3I, and the current flowing into the MN15 is I, which is the same as the current flowing into the MP15.

The phase compensation capacitors C1 and C2 are discharged by the difference 2I between the current I flowing through the MN15 and the current 3I flowing through the MN13, the gate voltages of the MP9 and the MN9 decrease, the output load capacitor is charged, and the voltage at the output terminal OUT becomes higher according to the voltage at the + input terminal INP.

On the other hand, if the voltage at the + input terminal becomes lower than the voltage at the output terminal, the drain current 2I flowing through the MN10 flows into the MN1, and no current flows into the MN2. Further, if the current of the intermediate stage floating current source symbol is 3I, the current flowing into the MP12 is 5I because the current 3I of the floating current source symbol is added to the current 2I of the MN1. Because the MP12 and the MP13 form a current mirror, the current 5I flows also into the MP13.

Further, the current flowing into the MN12 is the current 3I of the intermediate stage floating current source. Because the MN12 and the MN13 form a current mirror, the current flowing into the MN13 is 3I, and the current flowing into the MN15 is 5I, which is the same as the current flowing into the MP15.

The phase compensation capacitors C1 and C2 are discharged by the difference 2I between the current 5I flowing through the MN15 and the current 3I flowing through the MN13, the gate voltages of the MP9 and the MN9 decrease, the output load capacitor is charged, and the voltage at the output terminal OUT becomes lower according to the voltage at the + input terminal INP.

In this manner, the voltage at the output terminal OUT changes responsive to a change in the voltage at the + input terminal INP.

In the differential amplifier 400, as in the differential amplifier 200 shown in FIG. 4, the variable current source formed by the MP10 and the MN11 supplies the current for discharging the parasitic capacitor at the source of the N-transistor differential pair in the input stage 210 at the falling edge, thereby improving the symmetry of the output waveform between the rising edge and the falling edge.

Fourth Exemplary Embodiment

Figure 7:
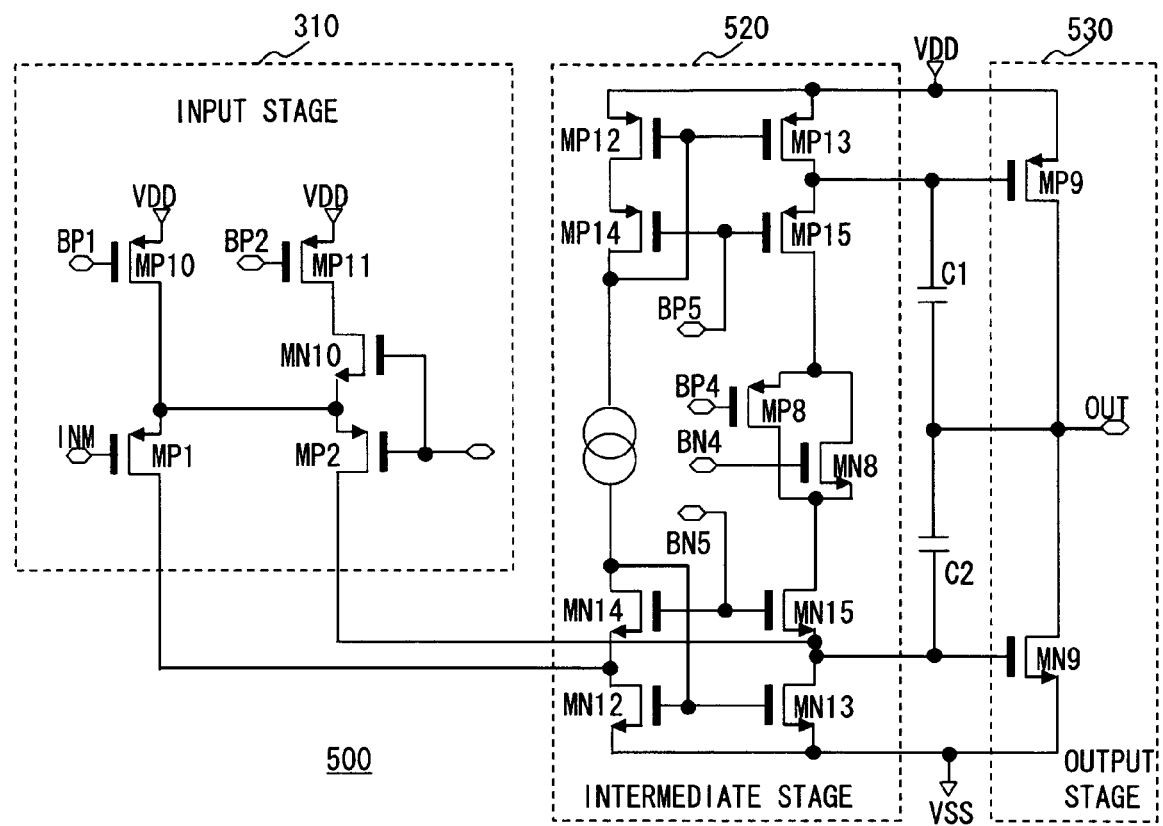
FIG. 7 is a view showing a differential amplifier according to a fourth exemplary embodiment of the present invention.
Figure 8:
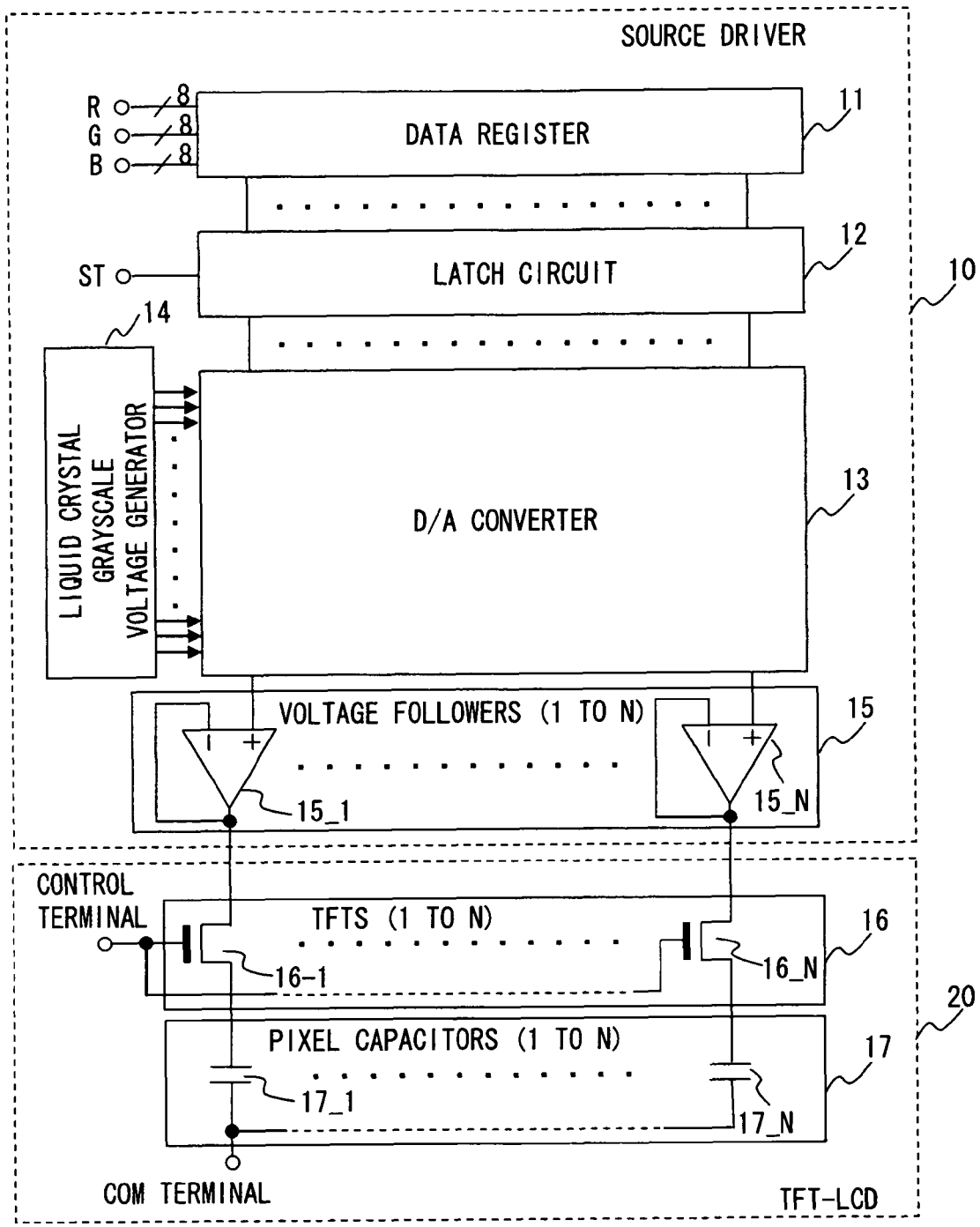
FIG. 8 is a schematic view of a liquid crystal display device.
Figure 9:
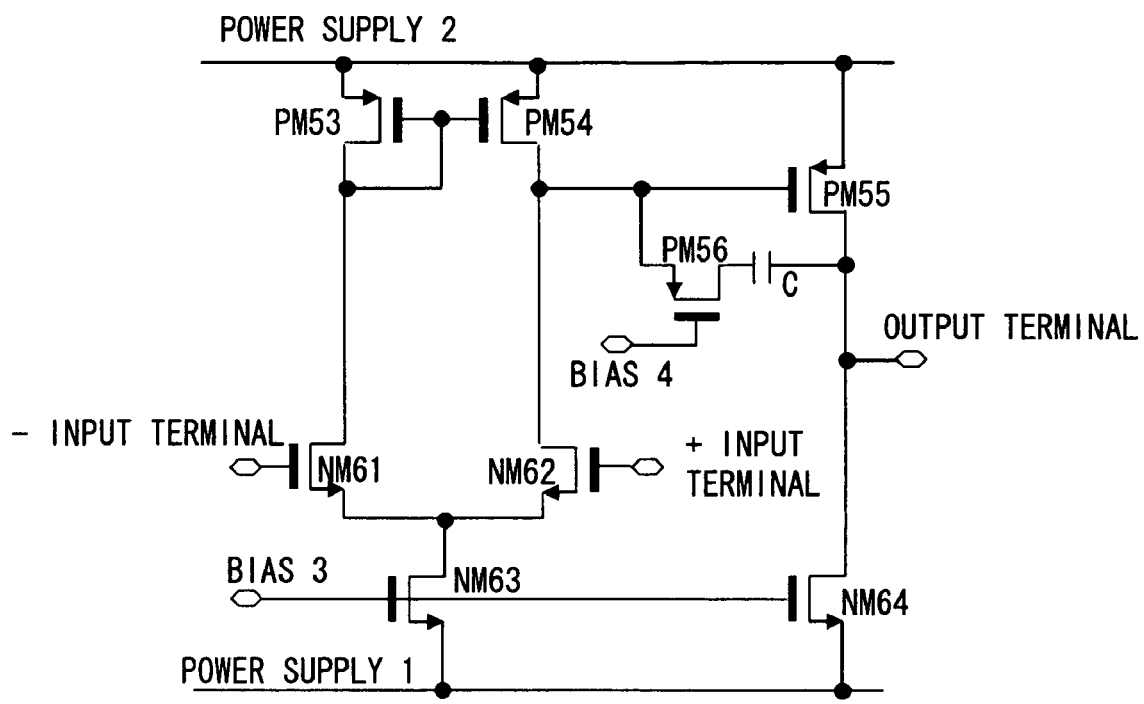
FIG. 9 is a view showing an example of the configuration of a differential amplifier used in a source driver of the liquid crystal display device shown in FIG. 8.

FIG. 7 shows a differential amplifier 500 according to a fourth exemplary embodiment of the present invention. The differential amplifier 500 includes an input stage 310, an intermediate stage 520 and an output stage 530.

The input stage 310 is the same as the input stage 310 in the differential amplifier 300 according to the second exemplary embodiment shown in FIG. 5.

The intermediate stage 520 is an intermediate stage in a folded cascode configuration, and it includes two floating current sources (current source symbol and MN8/MP8).

The drain of the P-transistor MP1 in the input stage 310 is connected to the drain of an N-transistor MN12 and the source of an N-transistor MN14 in the intermediate stage 520, and the drain of the P-transistor MP2 in the input stage 310 is connected to the drain of an N-transistor MN13 and the source of an N-transistor MN15 in the intermediate stage 520.

The sources and the gates of P-transistors MP12 and MP13 are respectively connected to each other, and the connected sources are connected to the VDD.

The source of a P-transistor MP14 is connected to the drain of the MP12, and the drain of the P-transistor MP14 is connected to the connected gates of the MP12 and the MP13. The source of a P-transistor MP15 is connected to the drain of the MP13, and the drain of the P-transistor MP15 is connected to the source of a P-transistor MP8 and the drain of an N-transistor MN8. The gates of the MP14 and the MP15 are connected to each other and further connected to a constant voltage source terminal BP5.

The sources and the gates of N-transistors MN12 and MN13 are respectively connected to each other, and the connected sources are connected to the VSS. The drains of the MN12 and the MN13 are connected to the sources of N-transistors MN14 and MN15, respectively. The drain of the MN14 is connected to the connected gates of the MN12 and the MN13. The drain of the MN15 is connected to the source of the MN8 and the drain of the MP8. The gates of the MN14 and the MN15 are connected to each other and further connected to a constant voltage source terminal BN5.

The gate of the P-transistor MP8 is connected to a constant voltage source terminal BP4, the source is connected to the drain of the MP15, and the drain is connected to the drain of the MN15.

The gate of the N-transistor MN8 is connected to a constant voltage source terminal BN4, the source is connected to the drain of the MN15, and the drain is connected to the drain of the MP15.

The MP8 and the MN8 function as a floating current source.

The output stage 530 is a class AB output stage that is controlled by the bias voltages BP4 and BN4, the MN8 and the MP8.

A P-transistor MP9 is an output transistor having the source connected to the VDD, the gate connected to the source of the MP8, and the drain connected to the output terminal OUT.

An N-transistor MN9 is an output transistor having the source connected to the VSS, the gate connected to the source of the MN8, and the drain connected to the output terminal OUT.

One end of a phase compensation capacitor C1 is connected to the gate of the MP9, and the other end is connected to the output terminal OUT. One end of a phase compensation capacitor C2 is connected to the gate of the MN9, and the other end is connected to the output terminal OUT.

The operation when the differential amplifier shown in FIG. 7 is connected in a voltage follower configuration is described hereinafter. It is assumed in this example that the drain current of the P-transistor MP10 that forms a constant current source in the input stage is 2I.

If the voltages at the + input terminal and the output terminal are equal, the current I that is one-half of the drain current flowing through the P-transistor MP10 in the input stage flows both into the drains of the MP1 and the MP2.

If the voltage at the + input terminal becomes higher than the voltage at the output terminal, the drain current 2I flowing through the MP10 flows into the MP1, and no current flows into the MP2. Further, if the current of the intermediate stage floating current source symbol is 3I, the current flowing into the MN12 is 5I because the current 3I of the floating current source symbol is added to the current 2I of the MP1. Since the MN12 and the MN13 form a current mirror, the current 5I flows also into the MN13.

Further, the current flowing into the MP12 is the current 3I of the intermediate stage floating current source. Because the MP12 and the MP13 form a current mirror, the current flowing into the MP13 is 3I, and the current flowing into the MP15 is 5I, which is the same as the current flowing into the MN15.

The phase compensation capacitors C1 and C2 are discharged by the difference 2I between the current 5I flowing through the MP15 and the current 3I flowing through the MP13, the gate voltages of the MP9 and the MN9 decrease, the output load capacitor is charged, and the voltage at the output terminal OUT becomes higher according to the voltage at the + input terminal INP.

On the other hand, if the voltage at the + input terminal becomes lower than the voltage at the output terminal, the drain current 2I flowing through the MP10 flows into the MP2, and no current flows into the MP1. Further, if the current of the intermediate stage floating current source symbol is 3I, the current flowing into the MN12 and the MN13 is 3I, and the current flowing into the MN15 is I because the current 2I out of the current 3I flowing through the MN13 is diverged into the MP2.

Further, the current flowing into the MP12 is the current 3I of the intermediate stage floating current source. Because the MP12 and the MP13 form a current mirror, the current flowing into the MP13 is 3I, and the current flowing into the MP15 is I, which is the same as the current flowing into the MN15.

The phase compensation capacitors C1 and C2 are discharged by the difference 2I between the current I flowing through the MP15 and the current 3I flowing through the MP13, the gate voltages of the MP9 and the MN9 decrease, the output load capacitor is charged, and the voltage at the output terminal OUT becomes lower according to the voltage at the + input terminal INP.

In this manner, the voltage at the output terminal OUT changes responsive to a change in the voltage at the input terminal INP.

In the differential amplifier 500, as in the differential amplifier 300 shown in FIG. 5, the variable current source formed by the MN10 and the MP11 supplies the current for charging the parasitic capacitor at the source of the P-transistor differential pair in the input stage 310 at the rising edge, thereby improving the symmetry of the output waveform between the rising edge and the falling edge.

Although exemplary embodiments of the present invention are described in the foregoing, the above-described exemplary embodiments are given by way of illustration only, and various changes and modifications may be made without departing from the scope of the invention. All such changes and modifications as would be obvious to one skilled in the art are intended for inclusion within the scope of the present invention.

For example, in the respective differential amplifiers shown in FIGS. 4 to 7, the variable current source for charging or discharging the parasitic capacitor at the source of the differential pair in the input stage has the configuration corresponding to the variable current source shown in FIG. 3. Alternatively, the variable current source in the input stage of those differential amplifiers may have the configuration corresponding to the variable current source shown in FIG. 2.

While the invention has been described in terms of several exemplary embodiments, those skilled in the art will recognize that the invention can be practiced with various modifications within the spirit and scope of the appended claims and the invention is not limited to the examples described above.

The above four exemplary embodiments can be combined as desirable by one of ordinary skill in the art.

Further, the scope of the claims is not limited by the exemplary embodiments described above.

Furthermore, it is noted that, Applicant's intent is to encompass equivalents of all claim elements, even if amended later during prosecution.

What is claimed is:

1. A differential amplifier comprising:
   an input circuit that receives differential inputs through a first input terminal and a second input terminal; and
   a subsequent-stage processing circuit that outputs an output according to the differential inputs received by the input circuit, wherein
   the input circuit includes
      a differential pair that is formed by a first transistor having a gate connected to the first input terminal and a second transistor having a gate connected to the second input terminal, the first transistor and the second transistor having sources connected to each other,
      a constant current source that is connected to the sources of the first transistor and the second transistor, and
      a variable current source that is connected to the sources of the first transistor and the second transistor,
   the subsequent-stage processing circuit includes a phase compensation capacitor and outputs an output responsive to a change in the differential inputs by charging and discharging the phase compensation capacitor through the constant current source, and
   the variable current source of the input circuit turns ON on condition that a change in the differential inputs reaches a level causing a parasitic capacitor at the sources of the differential pair to be charged or discharged, and supplies a current for charging or discharging the parasitic capacitor.

2. The differential amplifier according to claim 1, wherein
   the first transistor and the second transistor are N-channel MOS transistors,
   the subsequent-stage processing circuit outputs a rising edge by discharging the phase compensation capacitor through the constant current source when a voltage at the second input terminal becomes higher than a voltage at the first input terminal, and outputs a falling edge by charging the phase compensation capacitor through the constant current source when a voltage at the second input terminal becomes lower than a voltage at the first input terminal, and
   the variable current source turns ON on condition that a voltage at the second input terminal becomes lower than a voltage at the first input terminal, and supplies a current for discharging the parasitic capacitor at the sources of the differential pair.

3. The differential amplifier according to claim 2, wherein the variable current source includes a P-channel MOS transistor having a source connected to the source of the second transistor, a gate connected to the second input terminal and a drain connected to a lower voltage power supply.

4. The differential amplifier according to claim 2, wherein
   the variable current source includes a P-channel MOS transistor and an N-channel MOS transistor having drains connected to each other,
   the P-channel MOS transistor has a source connected to the source of the second transistor and a gate connected to the second input terminal, and
   the N-channel MOS transistor has a source connected to a lower voltage power supply and a gate connected to a bias voltage.

5. The differential amplifier according to claim 1, wherein
   the first transistor and the second transistor are P-channel MOS transistors,
   the subsequent-stage processing circuit outputs a rising edge by discharging the phase compensation capacitor through the constant current source when a voltage at the second input terminal becomes higher than a voltage at the first input terminal, and outputs a falling edge by charging the phase compensation capacitor through the constant current source when a voltage at the second input terminal becomes lower than a voltage at the first input terminal, and
   the variable current source turns ON on condition that a voltage at the second input terminal becomes higher than a voltage at the first input terminal, and supplies a current for charging the parasitic capacitor at the sources of the differential pair.

6. The differential amplifier according to claim 5, wherein the variable current source includes an N-channel MOS transistor having a source connected to the source of the second transistor, a gate connected to the second input terminal and a drain connected to a higher voltage power supply.

7. The differential amplifier according to claim 5, wherein
   the variable current source includes an N-channel MOS transistor and a P-channel MOS transistor having drains connected to each other,
   the N-channel MOS transistor has a source connected to the source of the second transistor and a gate connected to the second input terminal, and
   the P-channel MOS transistor has a source connected to a higher voltage power supply and a gate connected to a bias voltage.

* * * * *